(12) United States Patent
Birzer et al.

(10) Patent No.: US 7,521,809 B2
(45) Date of Patent: Apr. 21, 2009

(54) SEMICONDUCTOR DEVICE HAVING A CHIP STACK ON A REWIRING PLATE

(75) Inventors: Christian Birzer, Burglengenfeld (DE); Jens Pohl, Bernhardswald (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/588,401

(22) PCT Filed: Feb. 3, 2005

(86) PCT No.: PCT/DE2005/000175

§ 371 (c)(1),
(2), (4) Date: May 11, 2007

(87) PCT Pub. No.: WO2005/076319

PCT Pub. Date: Aug. 18, 2005

(65) Prior Publication Data
US 2007/0262467 A1 Nov. 15, 2007

(30) Foreign Application Priority Data
Feb. 4, 2004 (DE) .................. 10 2004 005 586

(51) Int. Cl.
*H01L 23/52* (2006.01)
*H01L 23/48* (2006.01)
*H01L 29/40* (2006.01)

(52) U.S. Cl. .............. 257/777; 257/E27.137; 257/685; 257/686; 257/723; 438/108; 438/109

(58) Field of Classification Search .......... 257/E27.137, 257/E27.144, E27.161, 723, 724, 685, 686, 257/777; 438/108, 109; 361/760
See application file for complete search history.

(56) References Cited

U.S. PATENT DOCUMENTS

| 5,930,599 | A | 7/1999 | Fujimoto et al. ............ 438/113 |
| 5,973,403 | A | 10/1999 | Wark ........................... 257/777 |
| 6,018,462 | A * | 1/2000 | Sakuyama ................... 361/777 |
| 6,071,754 | A | 6/2000 | Wark ........................... 438/106 |
| 6,157,080 | A * | 12/2000 | Tamaki et al. ............... 257/738 |
| 6,281,577 | B1 | 8/2001 | Oppermann et al. ........ 257/724 |
| 6,353,263 | B1 * | 3/2002 | Dotta et al. .................. 257/777 |
| 6,841,884 | B2 * | 1/2005 | Shizuno ...................... 257/777 |
| 6,870,249 | B2 * | 3/2005 | Egawa ......................... 257/686 |
| 2002/0004258 | A1 * | 1/2002 | Nakayama et al. .......... 438/107 |
| 2002/0045290 | A1 * | 4/2002 | Ball ............................. 438/106 |
| 2002/0192857 | A1 | 12/2002 | Igarashi et al. .............. 438/106 |
| 2003/0067076 | A1 | 4/2003 | Matsunaga ................... 257/758 |
| 2003/0122237 | A1 * | 7/2003 | Saeki .......................... 257/686 |

FOREIGN PATENT DOCUMENTS

| JP | 61-190950 A | 8/1986 |
| JP | 09-330993 A | 12/1997 |

* cited by examiner

*Primary Examiner*—Chris C. Chu
(74) *Attorney, Agent, or Firm*—Dicke, Billig, Czaja PLLC

(57) ABSTRACT

A semiconductor device having a semiconductor chip stack on a rewiring plate is disclosed. In one embodiment, the device includes an external contact area having a plurality of external contact area regions which are physically separate from one another is arranged on the underside. The individual external contact area regions are assigned to the individual semiconductor chips in the semiconductor chip stack. The external contact regions of an individual external contact area have a common external contact which electrically connects the external contact area regions.

24 Claims, 5 Drawing Sheets

SEMICONDUCTOR DEVICE HAVING A CHIP STACK ON A REWIRING PLATE

CROSS REFERENCE TO RELATED APPLICATION

This Utility Patent Application claims the benefit of the filing date of German Application No. 10 2004 005 586.6, filed Feb. 4, 2004, and International Application No. PCT/DE2005/000175, filed Feb. 3, 2005, both of which are herein incorporated by reference.

BACKGROUND

The invention relates to a semiconductor device having a semiconductor chip stack on a rewiring plate which bears the semiconductor chip stack on its top side and has a rewiring structure which is electrically connected to the contact areas of the semiconductor chips in the semiconductor chip stack. The invention also relates to a method for producing such a semiconductor device.

The document U.S. Pat. No. 5,973,403 discloses such a device for stacking two semiconductor chips which are intended for multichip modules (MCMs) and can be inserted into memory modules which have components fitted on one side (SIMMs, single in-line memory modules) or into memory modules which have components fitted on two sides (DIMMs, dual in-line memory modules). To this end, these memory modules have a base in the form of a printed circuit board. This printed circuit board has a rewiring structure on which contact pads for flip-chip contacts and contact pads for bonding wire connections are arranged.

In this prior art, the semiconductor chip stack is formed by a semiconductor chip having flip-chip contacts and a semiconductor chip having contact areas which can be bonded being stacked in such a manner that their rear sides rest on top of one another. In this case, the flip-chip contacts are directly connected to the rewiring structure and the stacked semiconductor chip is coupled to the rewiring structure via bonding wires, the associated contact pads for the semiconductor chips been joined together on the printed circuit board via rewiring lines.

One disadvantage of such a device resides in the fact that, after the electrical connections have been produced, the semiconductor chips in the semiconductor chip stack can only be tested together. The indication of a fault during testing thus does not provide any reliable statement as to which of the devices has caused a technical failure since the fault can no longer be unambiguously assigned. This disadvantage makes manufacturing analyses, fault frequency investigations and process optimization more difficult since, after bonding, only statements regarding the properties of the stack are possible. Unreliability in the contact-connection cannot be assigned either to an individual bonding connection or to an individual connection with a flip-chip contact.

The document U.S. Pat. No. 6,071,754 discloses a way of stacking two semiconductor chips which is similar to the document U.S. Pat. No. 6,007,752. In order to connect contact pads of the two types of semiconductor chip, the underside of the semiconductor plate is provided with a further rewiring structure in that case. In addition, provision is made of through-contacts to this rewiring structure on the underside. Nevertheless, the problem of the semiconductor chips which are connected to the rewiring structures on the top side and underside of the rewiring substrate or printed circuit board no longer being able to be tested individually is not solved.

For these and other reasons, there is a need for the present invention.

SUMMARY

The present invention provides a semiconductor device which has a semiconductor chip stack and in which, after the individual semiconductor chips in the semiconductor chip stack have been connected to the rewiring structures of a rewiring substrate, the functions of the individual semiconductor chips can also still be tested and malfunctions can be unambiguously assigned without interfering with the manufacturing costs, so that increased reliability of semiconductor devices having semiconductor chip stacks is achieved with the same manufacturing outlay.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not not necessarily to scale relative to each other. Like reference numerals designate corresponding similar parts.

Figure 1:
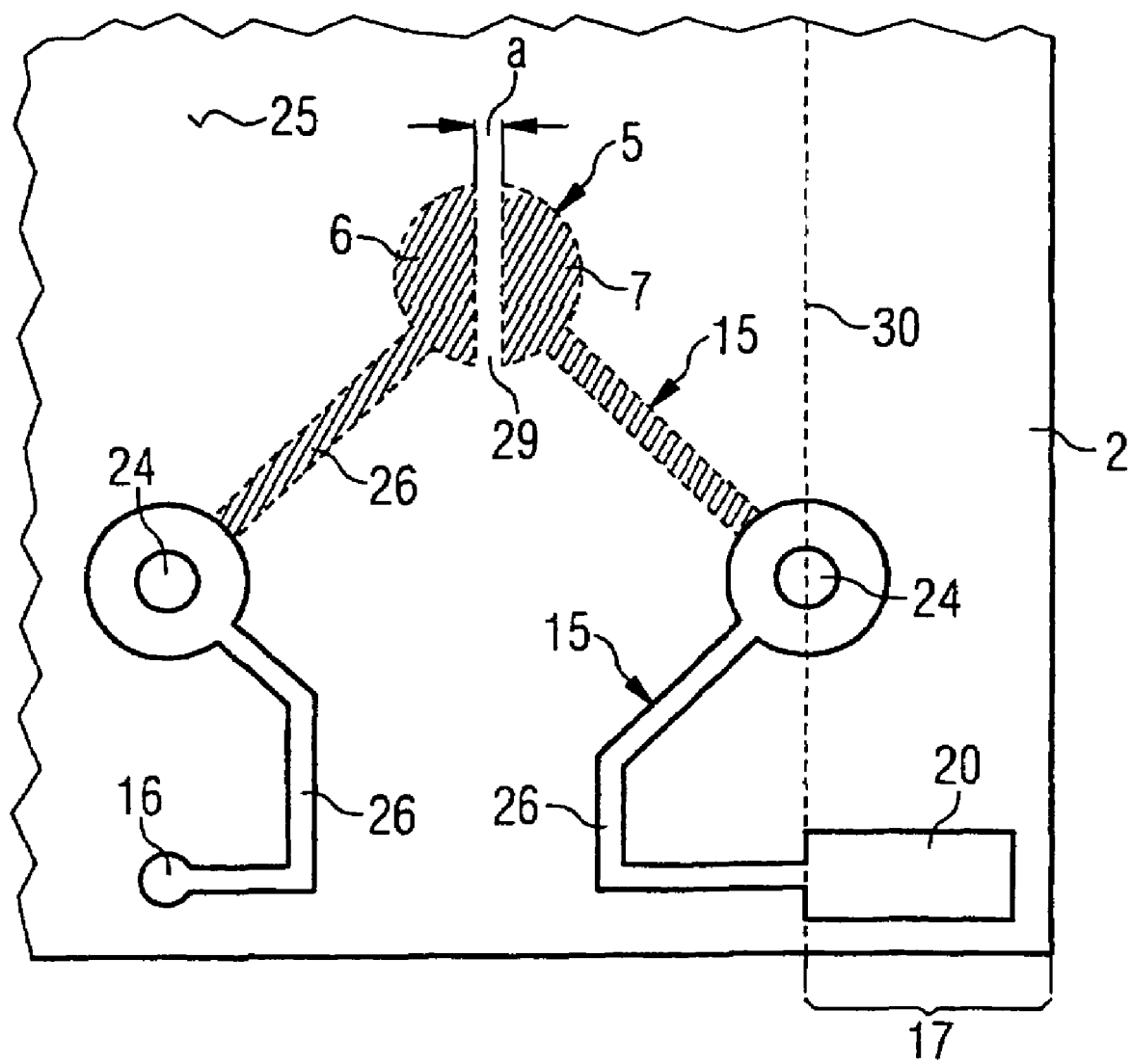
FIG. 1 illustrates a schematic plan view of a rewiring plate of a semiconductor device according to a first embodiment of the invention for stacking two semiconductor chips.

In one embodiment, the invention provides a semiconductor device having a semiconductor chip stack on a rewiring plate. The underside of the rewiring plate simultaneously forms the underside of the semiconductor device in this case. At least one external contact area having a plurality of external contact area regions which are physically separate from one another is arranged on this underside. The individual external contact area regions are assigned to the individual semiconductor chips in the semiconductor chip stack. The external contact area regions (which are physically separate from one another) of an individual external contact area are electrically connected via a common external contact.

This semiconductor device has the advantage that, before external contacts are applied to the external contact area regions of an individual external contact area of each semiconductor chip in the semiconductor chip stack within the semiconductor device, can be individually tested. In this case, the number of semiconductor chips is not restricted to two semiconductor chips in the stack but rather, depending on the size of the external contact area, a plurality of external contact area regions which are physically separate from one another can be provided in order to individually test a correspondingly large number of semiconductor chips in a semiconductor chip stack.

The size of a measurement probe also decides the possible number of semiconductor chips which can be stacked since the spatial extent of the measurement probe provides a minimum size for each of the external contact area regions. Given the currently available miniaturization of measurement probes and the technically expedient sizes of external contact areas, up to six external contact area regions of an external contact area can be physically separated from one another, with the result that up to six stacked semiconductor chips can be individually tested using the external contact area regions after the semiconductor device has been completed. External contacts can only be fitted after the test but the operation of fitting external contacts to physically separate external contact area regions is technically less problematical than the operation of internally wiring contact areas of semiconductor chips to corresponding rewiring structures of a rewiring printed board.

In one embodiment of the invention, the rewiring plate has, on its top side, a rewiring structure which, in its center, has contact pads for connecting a semiconductor chip to flip-chip contacts. The edge region of the rewiring plate, which surrounds the center, may have contact pads for bonding connection to one or more stacked semiconductor chips. Dividing the associated external contact areas on the underside of the rewiring plate into a plurality of external contact area regions of a single external contact area advantageously makes it possible both to inspect each individual flip-chip contact using the associated contact pads and to test each individual bonding connection if the bonding connections and the chip stack have already been embedded in a plastic housing composition on the top side of the rewiring plate.

Another advantage of such a semiconductor device is that it has a very compact chip stack because the rear side of the stacked semiconductor chip, which is to be provided with bonding connections, can be positioned on the rear side of the first semiconductor chip having flip-chip contacts. Such a technique makes it possible to approximately double the storage capacity both of a SIMM module and of a DIMM module.

In another embodiment of the invention, the rewiring plate has, in the center of its top side, a rewiring structure for fitting a rear side of a lower semiconductor chip. The rewiring structure also has, in the edge regions of the rewiring plate, contact pads for bonding connections to the top sides of the stacked semiconductor chips and of the lower semiconductor chip. This type of stacking, which begins with the rear side of a semiconductor chip, takes into account the fact that the next higher semiconductor chip stacks have a smaller circumference and a smaller active top side with contact areas, with the result that it is possible to interleave the semiconductor chips in the semiconductor chip stack, it being possible to access the edge regions of the respective top sides of the semiconductor chips and the contact areas arranged there.

In this type of stacking, it thus becomes possible to provide a bonding connection from the contact areas of the semiconductor chips in the semiconductor chip stack to the rewiring structure of the rewiring plate and, from there, to reach the underside of the rewiring plate and finally individual external contact area regions via rewiring lines of the top side of the rewiring plate and via through-contacts. The individual associated semiconductor chips can be individually tested using said external contact area regions. In this case, the through-contacts of the rewiring plate are used to connect the contact pads on the top side of the rewiring plate to the external contact area regions on the underside of the rewiring plate.

Rewiring lines which can be provided both on the top side and on the underside of the rewiring plate respectively lead to the through-contacts in order to ensure that external contact area regions are connected to the associated or corresponding contact pads of the individual semiconductor chips.

The semiconductor chips in a stack have, on their active top sides, contact areas which are connected, via flip-chip contacts and/or bonding connections, to the contact pads on the top side of the rewiring plate. The previous technologies can be used for such a bonding connection, the inventive semiconductor device having the advantage that each individual bonding connection of these bonding connections can still be tested after the bonding connections have been embedded in a plastic housing composition.

Another aspect of the invention relates to a panel or a rewiring substrate strip which has device positions which are arranged in rows and columns and have semiconductor devices. These semiconductor devices are patterned in such a manner that they have chip stacks in the semiconductor device positions on the top side of the panel, said chip stacks being connected to a rewiring structure on the top side of the panel via corresponding connections and having, on the underside, external contact areas which form external contact area regions which are physically separate from one another and correspond to the semiconductor chips in the semiconductor chip stack of the semiconductor device. Such a panel has the advantage that a standard plastic cover which covers a plurality of semiconductor device positions can be applied to the panel simultaneously for a plurality of semiconductor devices. After a plurality of semiconductor device positions have been covered with plastic, it is still also possible to individually test the individual semiconductor chips in a stack of semiconductor chips on the panel or rewiring substrate strip.

A method for producing and testing a panel having semiconductor devices which are arranged in rows and columns and have semiconductor chip stacks has the following method.

A circuit carrier having rewiring lines which are electrically connected, via through-contacts and contact pads on the top side of the circuit carrier, to external contact area regions on the underside of the circuit carrier is first of all produced in the form of a rewiring plate. To this end, the external contact area regions are patterned in such a manner that a plurality of external contact area regions are provided for the purpose of fitting an individual external contact. To this end, the external contact area regions are fitted such that they are physically separate but are not close to one another so that an individual external contact can electrically connect them to one another.

After a circuit carrier which is patterned in this manner has been produced, a stack of semiconductor chips is applied to the circuit carrier with connection of contact areas of the semiconductor chips to contact pads on the top side of the circuit carrier. The circuit carrier can then be covered with a plastic composition in the region of the semiconductor device positions. This covering has the advantage that, in the subsequent testing method, the sensitive electrical connections between the rewiring structure of the rewiring plate and the individual semiconductor chips in the semiconductor chip stack have already been solidly protected by the plastic cover. The individual semiconductor chips in a semiconductor chip stack are then tested using the corresponding external contact area regions on the underside of the circuit carrier. On account of the special pattern of the physical arrangement of the external contact area regions, each individual semiconductor chip of the semiconductor chips can be individually tested from the underside of the panel. After testing, the defective semiconductor devices can be marked in order to individually inspect them and their faults.

In order to then produce semiconductor devices from this tested panel, further steps are required. After the panel has been produced in the manner described above, external contacts are applied to the external contact area regions with electrical connection of the external contact area regions. The panel is then separated into individual semiconductor devices. The advantage of producing semiconductor devices having semiconductor chip stacks in this manner can be seen in the fact that, despite a plurality of semiconductor chip stacks being packaged in one panel, it becomes possible to individually test each individual semiconductor chip in order to implement more accurate fault analyses in the case of functional faults.

In summary, it can be established that the present invention makes it possible to subsequently connect stacked semiconductor chips. In particular, the invention results in devices for a so-called ball-grid array (BGA) design. In this BGA design, the semiconductor device has, on its underside, a grid-like arrangement of external contacts in the form of solder balls, solder beads or solder bumps. The underside having the external contacts is carried by a rewiring plate on which a stack of semiconductor chips may be situated, it being possible for said semiconductor chips to be arranged differently in this invention.

A combination of a wide variety of semiconductor chips and the external contacts may thus be connected to the rewiring plate. These semiconductor chips in a stack may be based on flip technology and/or on semiconductors with a bonding wire connection. A stack may also have solely semiconductor chips which are based only on bonding wire connections. It is also possible to provide semiconductor chips which are stacked by being arranged next to one another on their side edges and being connected to the external contacts of the rewiring plate via the side edges. These different constructions are also referred to as a flip-chip wire bond stack, a wire bond/wire bond stack and/or a side-by-side multichip package (SSMCP) in semiconductor technology.

In this case, the invention advantageously makes it possible for the electrical connection to the external contacts to be configured in such a manner that, despite the semiconductor device having been completed, the chips are not yet electrically connected to one another and can thus be electrically tested individually from outside the underside of the semiconductor device. These connections of the individual lines to the individual chips are only realized via the external contacts in the form of solder balls, solder beads or solder bumps. This has the following advantages:

1. First of all, the semiconductor chips can be electrically tested completely separately from one another without said chips influencing one another. By way of example, a baseband chip and a DRAM chip or an analog chip and a digital chip can thus be tested in a manner such that they are completely insulated from one another and can be individually tested even though they have already been completely packaged in the device housing. The testing operation may even be carried out on a panel or a substrate strip, on which a plurality of devices are present in groups under a plastic cover, even before this substrate strip or the panel is separated into individual semiconductor devices.
2. It is also possible to finally implement different options for the semiconductor device only when the external contacts are being applied to the external contact area regions of the invention. To this end, an external contact is either applied and a connection is thus established between the semiconductor chips or this external contact is then omitted for another function. By way of example, particular functions of a multichip system may thus be enabled only when external contacts are fitted or are not fitted to the inventive external contact regions. A particular operating state of a chip may thus be achieved, for example, when common external contacts are used, for example in the case of a DRAM which is intended to be operated in different modes, for example in a x4, x8, x16 or x32 mode.

The invention will now be explained in more detail with reference to the accompanying figures.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 illustrates a schematic plan view of a rewiring plate 2 of a semiconductor device according to a first embodiment of the invention for stacking two semiconductor chips. The plan view depicted in FIG. 1 is only a partial view of the top side 25 of the rewiring plate 2. Solid lines are used to illustrate the rewiring structures 15 on the top side 25 of the rewiring plate 2 in FIG. 1. Dashed/hatched areas are used to illustrate the rewiring structures on the underside of the rewiring plate 2. Two types of contact pads 16 and 20 are therefore illustrated on the top side 25 of the rewiring plate 2.

The larger contact pads 20 are arranged in an edge region 17 of the top side 25 of the rewiring plate and are used to fit bonding wire connections. In the present case, they have a length of approximately 150 µm and a width in the range from 70 to 100 µm in order to hold correspondingly thick bonding wires on the contact pad 20. In contrast, the contact pad 16 only has a diameter of a few 10 micrometers which, in the present case, is approximately 60 to 80 µm and is used to connect flip-chip contacts to the rewiring structure 15 on the top side 25 of the rewiring plate 2.

Separate rewiring lines 26 lead, from the contact pads 16 and 20, to through-contacts 24 which electrically connect the rewiring structure 15 on the top side 25 of the rewiring plate 2 to the rewiring structures 15 on the underside of the rewiring plate 2. Furthermore, the rewiring lines 26 for the contact pads 16 and 20 are also separate from one another on the underside of the rewiring plate 2. In addition, they are not electrically connected to one another by means of the external contact area 5 which is arranged on the underside. Rather, they are connected to physically separate external contact area regions 6 and 7 which are separated by means of a gap 29. The gap 29 has a distance a between an external contact region 6, which corresponds to the contact pad 16 for flip-chip contacts, and the contact area region 7 which corresponds to the contact pad 20 for bonding wire connections. The distance a also electrically separates the two external contact area regions 6 and 7 from one another, with the result that the semiconductor chips in the chip stack can be individually tested. After the test, a common external contact which provides an electrical connection can then be applied to the external contact area regions 6 and 7 of the external contact area 5.

Figure 2:
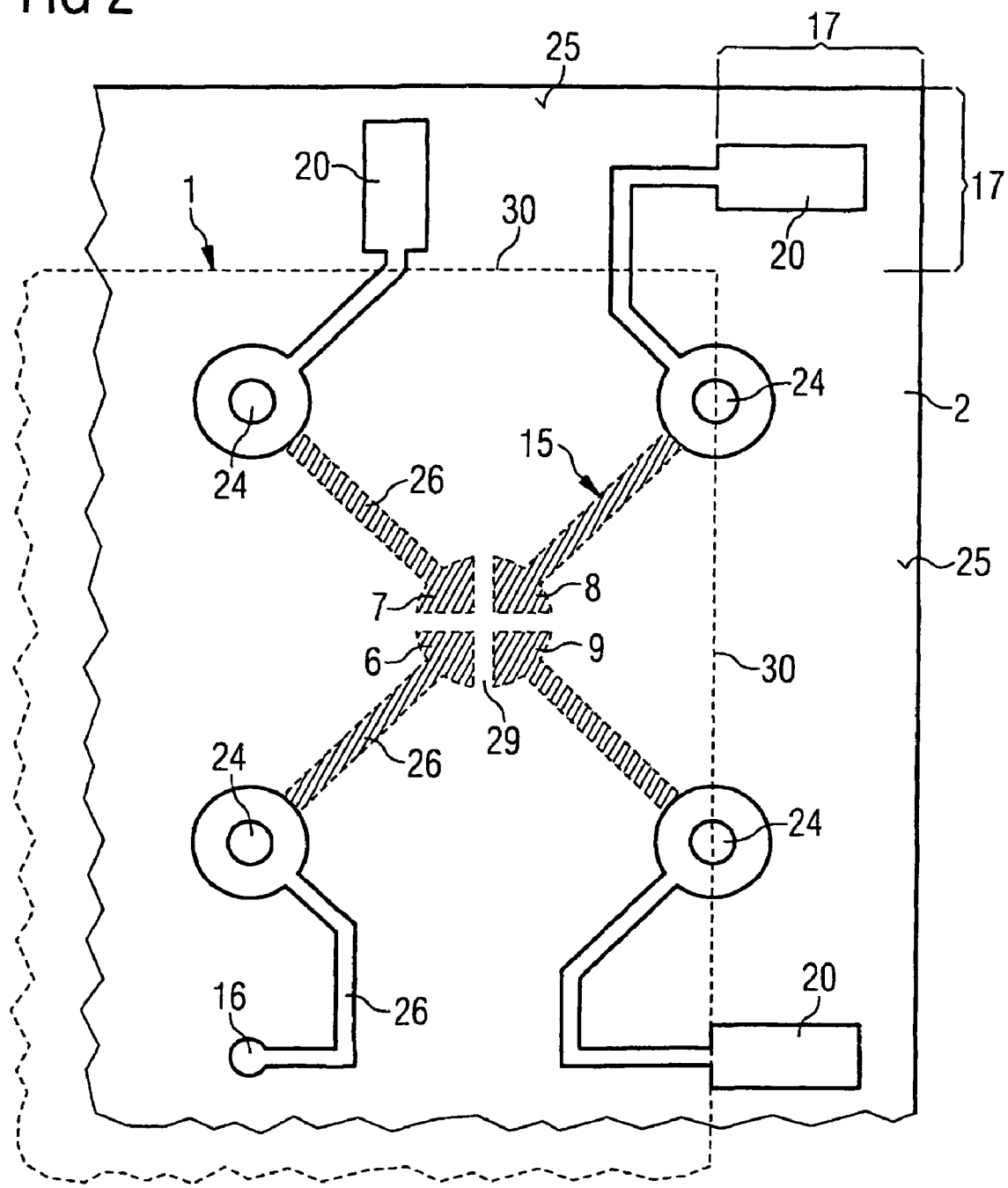
FIG. 2 illustrates a schematic plan view of a rewiring plate of a semiconductor device according to a second embodiment of the invention for stacking four semiconductor chips.

FIG. 2 illustrates a schematic plan view of a rewiring plate 2 of a semiconductor device according to a second embodiment of the invention for stacking four semiconductor chips. Components having the same functions as in FIG. 1 are labeled with the same reference symbols and are not additionally discussed. FIG. 2 illustrates a corner region of the top side 25 of the rewiring plate 2. Three contact pads 20 for fitting bonding wire connections are arranged in this corner region so that it is possible to connect three stacked semiconductor chips for bonding wire connections via these contact pads 20 to the external contact area regions 7, 8 and 9 on the underside of the rewiring plate 2 via the through-contacts 24.

In contrast to the three stacked semiconductor chips, the lowermost semiconductor chip may have flip-chip contacts which are arranged on contact pads 16 for flip-chip contacts, said contact pads being situated under the semiconductor chip stack 1 whose outer contour is marked by the dashed line 30. Four semiconductor chips in a semiconductor chip stack can thus be tested separately and individually using the external contact area regions 6, 7, 8 and 9 via the rewiring plate 2 of the second embodiment of the invention according to figure 2, their contact areas (not illustrated here) being electrically connected to one another only when applying external contacts.

Figure 3:
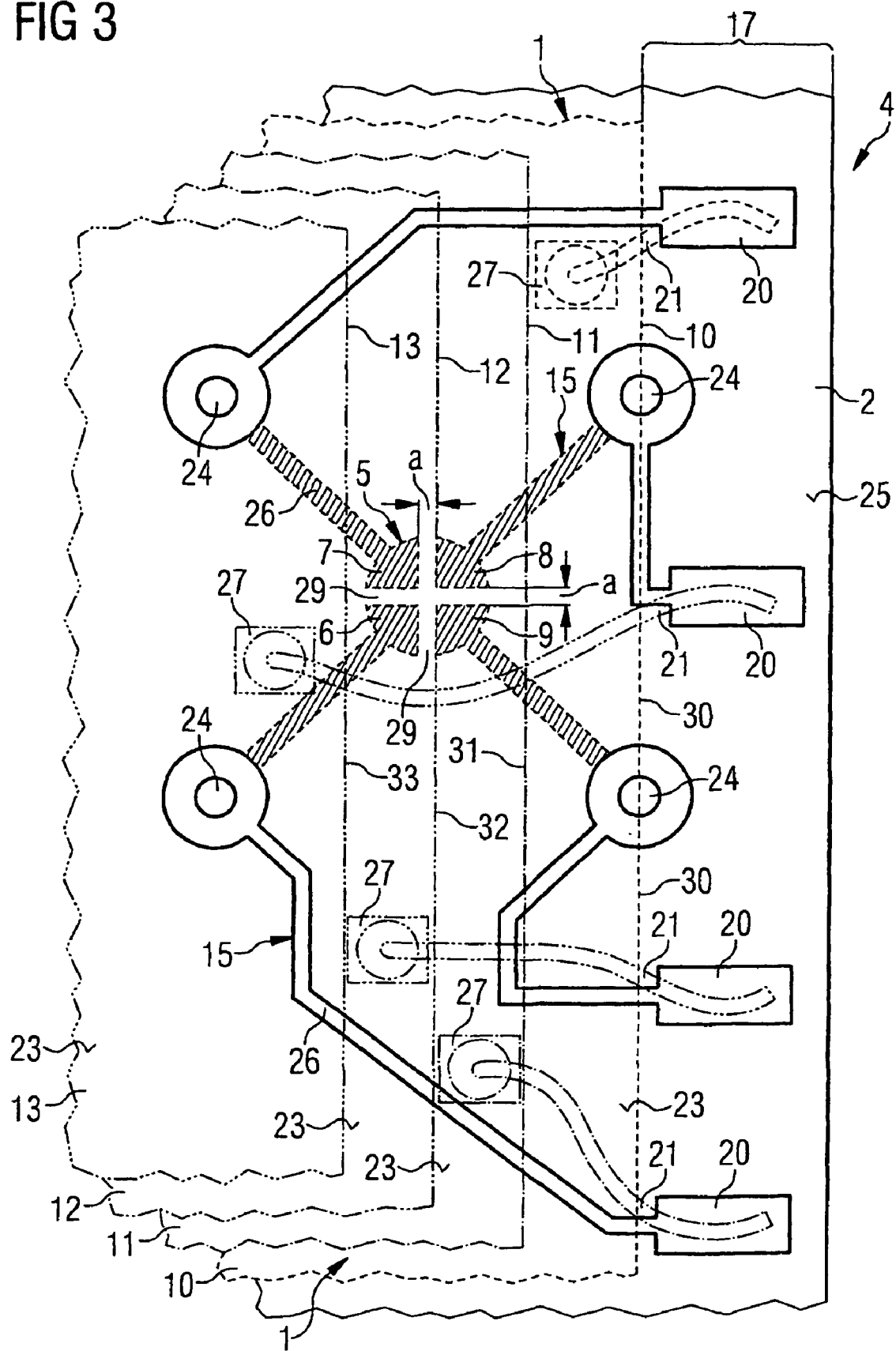
FIG. 3 illustrates a schematic plan view of a rewiring plate of a semiconductor device according to a third embodiment of the invention.

FIG. 3 illustrates a schematic plan view of a rewiring plate 2 of a semiconductor device 4 according to a third embodiment of the invention. An edge region 17 of the rewiring plate 2 and the position of the edges 30, 31, 32 and 33 of stacked semiconductor chips 10, 11, 12 and 13 are illustrated relative to one another in FIG. 3. Solid lines are used to mark the top side 25 of the rewiring plate 2. A dashed line 30 is used to mark an edge side of a lowermost semiconductor chip 10, this semiconductor chip 10 being applied to the top side 25 of the rewiring plate 2 by material bonding. A dashed line is likewise used to mark a contact area 27 on the top side 23 of the semiconductor chip 10 in FIG. 3.

The edge of the next stacked semiconductor chip 11, which is marked using a dash-dotted line 31, is set back to such an extent that the contact area 27 of the semiconductor chip 10 remains accessible. A bonding connection 21 which is likewise marked using dashed lines may thus be arranged from the contact area 27 of the semiconductor chip 10 to the contact pad 20 on the top side 25 of the rewiring plate 2.

The edge of the next stacked semiconductor chip 12 is marked using a dash-double dotted line 32 and is set back to such an extent that the contact area 27 of the semiconductor chip 11 situated underneath it remains freely accessible. It is thus possible to connect the contact area 27 (marked using a dash-dotted line) of the semiconductor chip 11 to a contact pad 20 via a bonding connection 21 which is marked using a dash-dotted line. The side edge of the fourth semiconductor chip 13 in this stack is marked using a dash-triple dotted line 33 and has, on the semiconductor chip 13, a contact area 27 which is likewise marked using a dash-triple dotted line and is connected, via a corresponding bonding connection 21, to a corresponding contact pad 20 on the top side 25 of the rewiring plate 2. The four contact pads 20 depicted on the top side 25 of the rewiring plate 2 are connected, via four through-contacts 24, to the four external contact area regions 6, 7, 8 and 9 of an external contact area 5 on the underside of the rewiring plate 2.

The pattern on the underside of the rewiring plate 2 is again marked using dashed hatched areas. The semiconductor stack is potted in a plastic composition which is not illustrated in FIG. 3, with the result that only the underside of the rewiring plate 2 is accessible for a test. The inventive arrangement of the rewiring structures 15 makes it possible for each semiconductor chip 10 to 13 in the stack 1 of this semiconductor device 4 to be individually tested even after bonding and even after the plastic composition has been applied.

Figure 4:
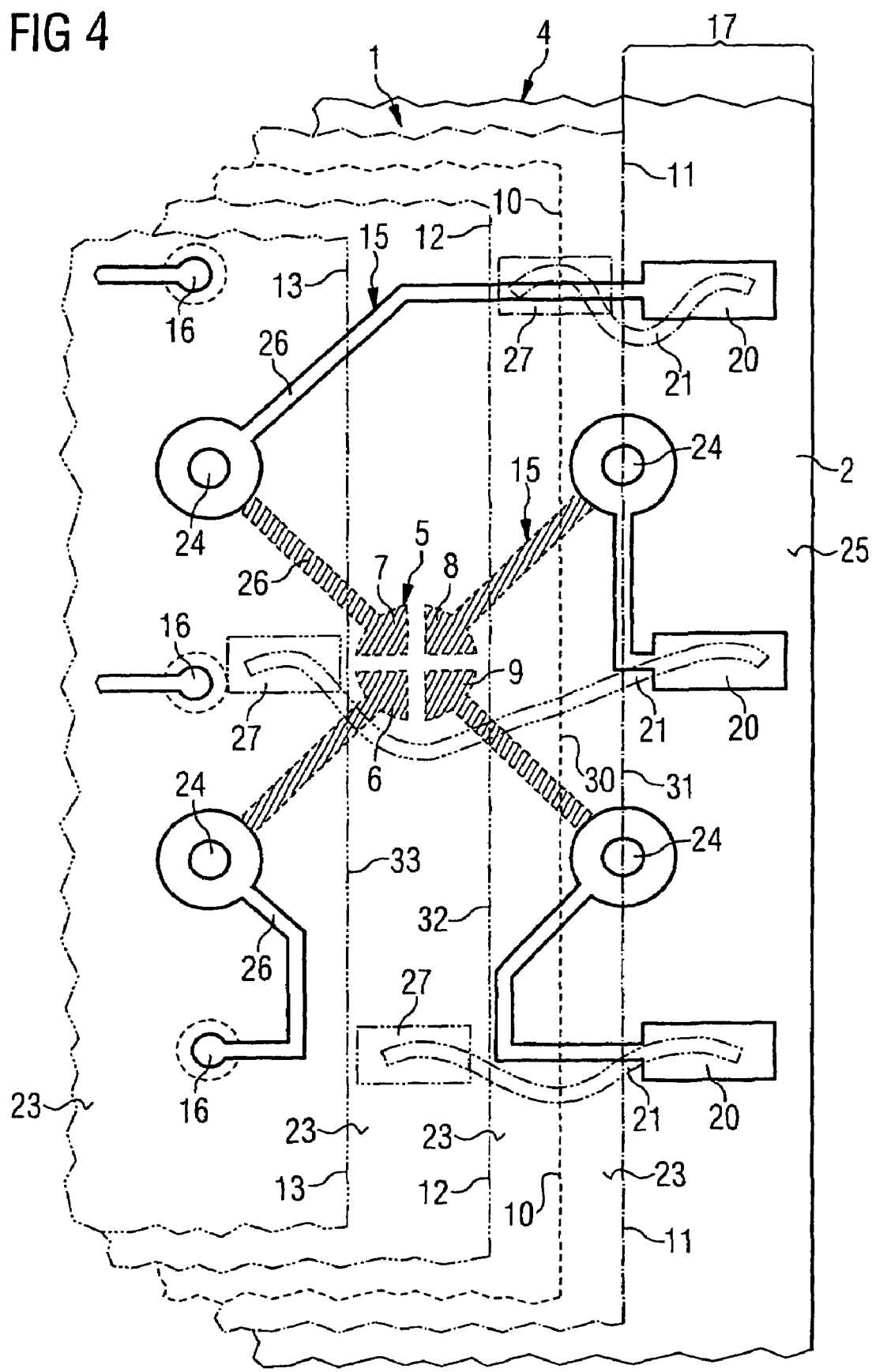
FIG. 4 illustrates a schematic plan view of a rewiring plate having stacked semiconductor chips according to FIG. 3.

FIG. 4 illustrates a schematic plan view of a rewiring plate 2 having four stacked semiconductor chips 10, 11, 12 and 13 like in FIG. 3. Components having the same functions as in FIG. 3 are labeled with the same reference symbols and are not additionally discussed. The difference from FIG. 3 is that the lowermost semiconductor chip 10, whose edge is marked using a dashed line 30, does not require any bonding connections but rather is connected, via flip-chip contacts, to corresponding contact pads 16 which are arranged under the semiconductor chip stack 1 on the top side 25 of the rewiring plate 2.

The three upper stacked semiconductor chips 11, 12 and 13 are again arranged, with their edge sides staggered, in such a manner that their contact areas 27 can be connected, via bonding connections 21, to the corresponding contact pads 20 in the edge region 17 of the top side 25 of the rewiring plate 2. The external contact area 5 on the underside of the rewiring plate 2 is again divided into four external contact area regions 6, 7, 8 and 9, the external contact area region 6 being reserved for connection to the flip-chip contacts of the lowermost semiconductor chip 10. The advantage of this type of stacking in FIG. 4 over the stacking in FIG. 3 is that the edge side of the semiconductor chip 11 does not have to be arranged such that it is offset from the edge side of the lowermost semiconductor chip 10, with the result that, with an appropriate stack height, as in FIG. 3, the uppermost semiconductor chip 13 can have a larger active top side 23 than in FIG. 3.

Figure 5:
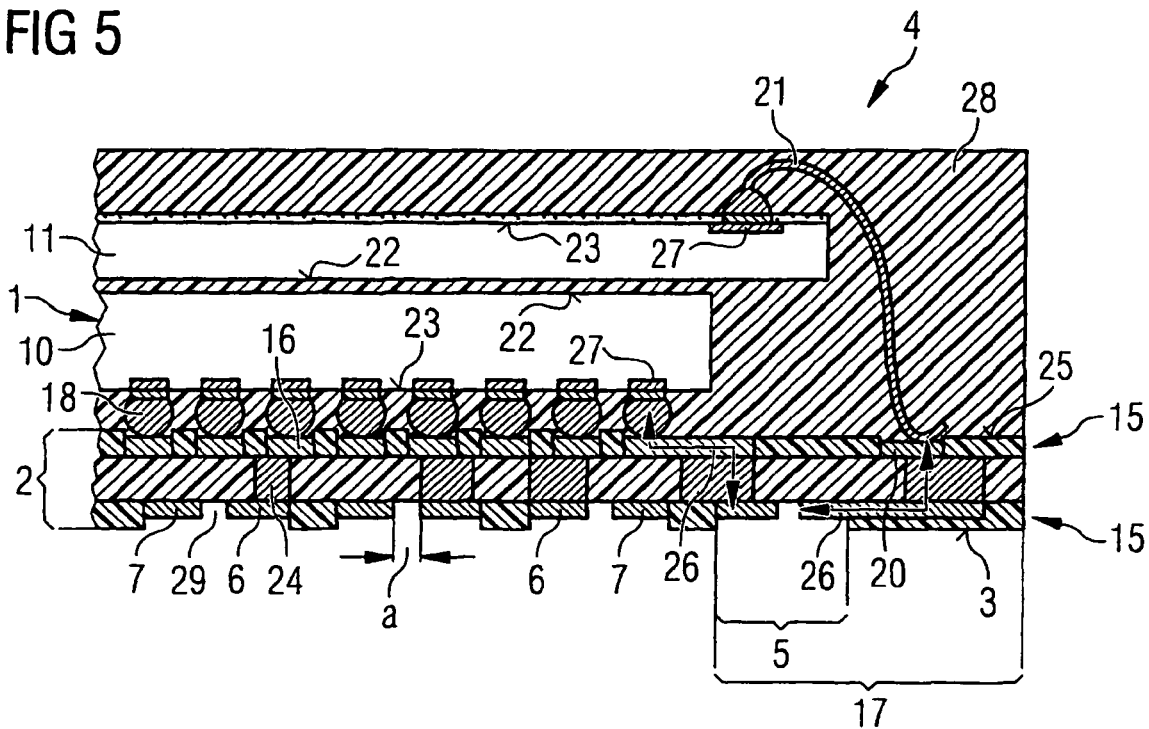
FIG. 5 illustrates a schematic cross section through a semiconductor device having a semiconductor chip stack according to the first embodiment of the invention illustrated in FIG. 1, with the possibility of individually testing the stacked semiconductor chips in the semiconductor chip stack.

FIG. 5 illustrates a schematic cross section through a semiconductor device 4 having a semiconductor chip stack 1 according to the first embodiment of the invention illustrated in FIG. 1, with the possibility of individually testing the stacked semiconductor chips 10 and 11 in the semiconductor chip stack 1. The semiconductor chip 10 has an active top side 23 with contact areas 27 which are fitted with flip-chip contacts 18. These flip-chip contacts 18 are partially connected, via through-contacts 24 of the rewiring plate 2, to external contact area regions 6 on the underside 3 of the rewiring plate 2. The rear side 22 of a further semiconductor chip 11 having a top side 23 with contact areas 27 in the edge region of the semiconductor chip 11 is stacked on the rear side 22 of the lower semiconductor chip 10. These contact areas 27 of the semiconductor chip 11 are connected, via bonding connections 21, to corresponding contact pads 20 on the top side 25 of the rewiring plate 2.

The contact pads 27 of the upper semiconductor chip 11 are assigned, via a through-contact 24, to external contact area regions 7 of individual external contact areas 5. The external contact area regions 6 and 7 are electrically separate from one another at a distance a on the underside 3 of the rewiring plate 2, with the result that a continuous gap 29 ensures that the contact areas 27 of the upper semiconductor device 11 can be tested using the external contact area regions 7 and the contact areas 27 of the lower semiconductor chip 10 can be electrically inspected using the external contact area regions 6. This inspection is also still possible if, as illustrated in FIG. 5, the semiconductor chip stack 1 has been potted in a plastic composition 28.

Figure 6:
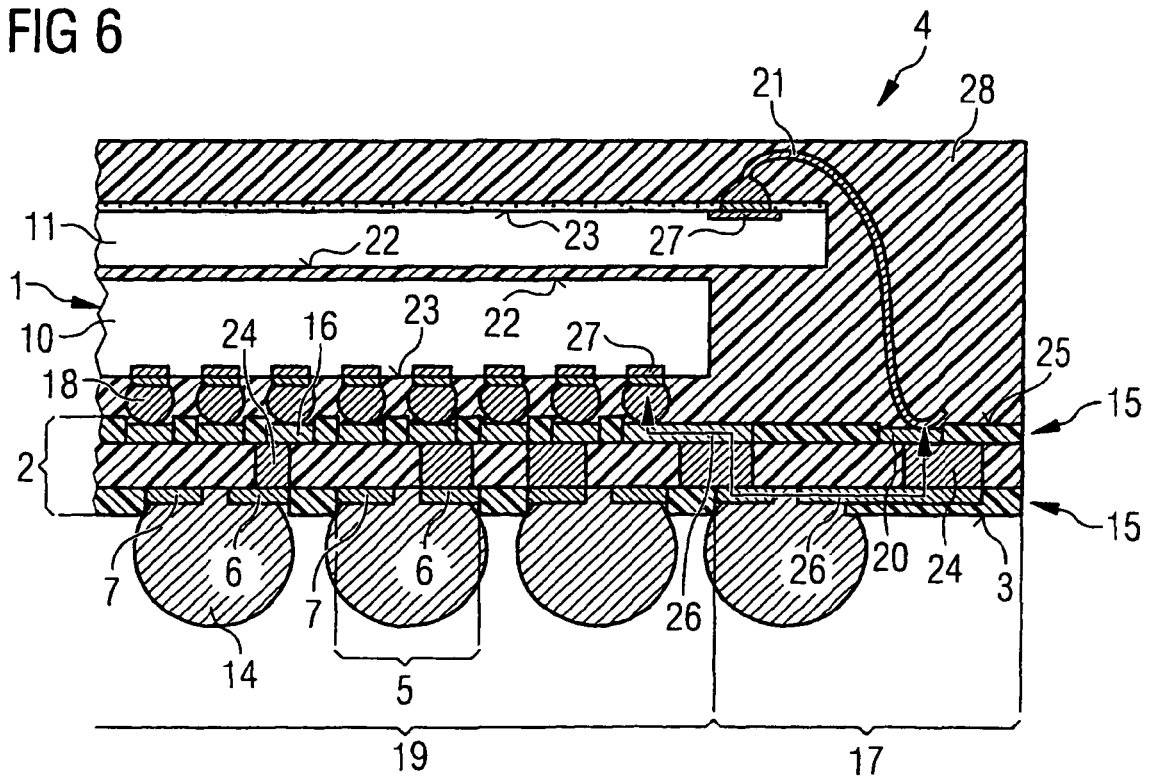
FIG. 6 illustrates a schematic cross section of the semiconductor device according to FIG. 5 after external contacts have been fitted to the underside of the semiconductor device.

FIG. 6 illustrates a schematic cross section of the semiconductor device 4 according to FIG. 5 after external contacts 14 have been applied to the underside 3 of the semiconductor device 4. Components having the same functions as in FIG. 5 are labeled with the same reference symbols and are not additionally discussed. Applying the external contacts 14 results in the mutually corresponding contact areas 27 of the semiconductor chip 10 now being electrically connected in the center 19 of the rewiring plate 2 and of the semiconductor chip 11. This electrical connection can also be carried out on a substrate strip having a plurality of semiconductor devices 4 under a common plastic cover, so that, after the substrate strip has been separated into a plurality of semiconductor devices 4, semiconductor devices which have been accurately tested are available.

What is claimed is:

1. A semiconductor device comprising:
   a semiconductor chip stack on a rewiring plate, the underside of the rewiring plate forming the underside of the semiconductor device;
   an external contact area having a plurality of individual external contact area regions which are physically separate from one another being arranged on the underside;
   each of the individual external contact area regions being assigned to a different one of the individual semiconductor chips in the semiconductor chip stack; and
   individual external contact regions of the external contact area being electrically connected via a common external contact.

2. The semiconductor device of claim 1, wherein the rewiring plate comprises, on its top side, a rewiring structure which comprises, in the center of the rewiring plate, contact pads for connecting a semiconductor chip to flip-chip contacts and comprises, in the edge region, contact pads for bonding connections to a stacked semiconductor chip.

3. The semiconductor device of claim 1, wherein the rewiring plate comprises, in the center of its top side, a rewiring structure for fitting the rear side of a lower semiconductor chip and comprises, in the edge regions, contact pads for bonding connections to top sides of the stacked semiconductor chips.

4. The semiconductor device of claim 1, wherein the rewiring plate comprises through-contacts via which the contact pads on the top side of the rewiring plate are connected to the external contact area regions on the underside of the rewiring plate.

5. The semiconductor device of claim 1, wherein the rewiring plate comprises rewiring lines which connect the external contact area regions to the contact pads.

6. The semiconductor device of claim 1, wherein the semiconductor chips of the semiconductor device comprise, on their active top sides, contact areas which are connected, via flip-chip contacts and/or bonding connections, to the contact pads on the top side of the rewiring plate.

7. The semiconductor device of claim 1, wherein the semiconductor chip stack on the rewiring plate is embedded in a plastic composition.

8. A panel which comprises device positions which are arranged in rows and columns and have semiconductor devices of claim 1.

9. A semiconductor device comprising:
   a semiconductor chip stack on a rewiring plate, the underside of the rewiring plate forming the underside of the semiconductor device;
   an external contact area having a plurality of individual external contact area regions which are physically separate from one another being arranged on the underside;
   each of the individual external contact area regions being assigned to a different one of the individual semiconductor chips in the semiconductor chip stack; and
   the individual external contact regions of the external contact area being electrically connected via a common external contact;
   wherein the rewiring plate comprises, on its top side, a rewiring structure which comprises, in the center of the rewiring plate, contact pads for connecting a semiconductor chip to flip-chip contacts and comprises, in the edge region, contact pads for bonding connections to a stacked semiconductor chip, and wherein the rewiring plate comprises through-contacts via which the contact pads on the top side of the rewiring plate are connected to the external contact area regions on the underside of the rewiring plate.

10. The semiconductor device of claim 9, wherein the rewiring plate comprises rewiring lines which connect the external contact area regions to the contact pads.

11. The semiconductor device of claim 10, wherein the semiconductor chips of the semiconductor device comprise, on their active top sides, contact areas which are connected, via flip-chip contacts and/or bonding connections, to the contact pads on the top side of the rewiring plate.

12. The semiconductor device of claim 11, wherein the semiconductor chip stack on the rewiring plate is embedded in a plastic composition.

13. The semiconductor device of claim 12, wherein the rewiring plate comprises, on its top side, a rewiring structure which comprises, in the center of the rewiring plate, contact pads for connecting a semiconductor chip to flip-chip contacts and comprises, in the edge region, contact pads for bonding connections to a stacked semiconductor chip.

14. A semiconductor device comprising:
   a semiconductor chip stack on a rewiring plate, the underside of the rewiring plate forming the underside of the semiconductor device;
   means for providing an external contact area having a plurality of individual external contact area regions which are physically separate from one another being arranged on the underside;
   each of the individual external contact area regions being assigned to a different one of the individual semiconductor chips in the semiconductor chip stack; and
   the individual external contact regions of the external contact area being electrically connected via a common external contact.

15. The semiconductor device of claim 14, wherein the rewiring plate comprises, on its top side, a rewiring structure which comprises, in the center of the rewiring plate, contact pads for connecting a semiconductor chip to flip-chip contacts and comprises, in the edge region, contact pads for bonding connections to a stacked semiconductor chip.

16. The semiconductor device of claim 14, wherein the rewiring plate comprises, in the center of its top side, a rewiring structure for fitting the rear side of a lower semiconductor chip and comprises, in the edge regions, contact pads for bonding connections to top sides of the stacked semiconductor chips.

17. The semiconductor device of claim 14, wherein the rewiring plate comprises through-contacts via which the contact pads on the top side of the rewiring plate are connected to the external contact area regions on the underside of the rewiring plate.

18. The semiconductor device of claim 14, wherein the rewiring plate comprises rewiring lines which connect the external contact area regions to the contact pads.

19. The semiconductor device of claim 14, wherein the semiconductor chips of the semiconductor device comprise, on their active top sides, contact areas which are connected, via flip-chip contacts and/or bonding connections, to the contact pads on the top side of the rewiring plate.

20. The semiconductor device of claim 14, wherein the semiconductor chip stack on the rewiring plate is embedded in a plastic composition.

21. A semiconductor device comprising:
- a rewiring plate having a top side and an underside, the underside of the rewiring plate forming an underside of the semiconductor device;
- a plurality of semiconductor chips stacked on the top side of a rewiring plate, the semiconductor chips stacked in an off-set fashion so as to expose at least a portion of a top side of each of the semiconductor chips, the exposed portion of the top side of each semiconductor chip including at least one contact area;
- an external contact area on the underside of the rewiring plate, the external contact area having a plurality of individual external contact area regions which are physically separate from one another, each of the individual external contact area regions being assigned to one of the semiconductor chips of the plurality of semiconductor chips; and
- a common external contact which electrically connects each of the individual external contact regions of the external contact area to one another.

22. The semiconductor device of claim 21, wherein the common external contact comprises a solder bump.

23. The semiconductor device of claim 21, wherein each of the individual external contact area regions is coupled to the at least one contact area on the exposed portion of the top surface of the corresponding semiconductor chip using a bonding wire.

24. The semiconductor device of claim 23, wherein each of the bondingwires is coupled to a corresponding contact area on the top side of the rewiring plate, and wherein the corresponding contact area is coupled to the corresponding individual external contact area region by a via extending through the rewiring plate and a rewiring structure disposed on the underside of the rewiring plate.

* * * * *

UNITED STATES PATENT AND TRADEMARK OFFICE
CERTIFICATE OF CORRECTION

PATENT NO. : 7,521,809 B2
APPLICATION NO. : 10/588401
DATED : April 21, 2009
INVENTOR(S) : Birzer et al.

Page 1 of 1

It is certified that error appears in the above-identified patent and that said Letters Patent is hereby corrected as shown below:

Column 9, line 30, delete "individual" and insert in place thereof --the individual--.

Column 12, line 17, delete "bondingwires" and insert in place thereof --bonding wires--.

Column 12, line 20, delete "a via".

Signed and Sealed this

Eighteenth Day of August, 2009

David J. Kappos
*Director of the United States Patent and Trademark Office*